United States Patent
Pu et al.

(10) Patent No.: US 9,577,069 B1
(45) Date of Patent: Feb. 21, 2017

(54) METHOD OF FABRICATING SEMICONDUCTOR MOS DEVICE

(71) Applicant: UNITED MICROELECTRONICS CORP., Hsin-Chu (TW)

(72) Inventors: Shih-Chieh Pu, New Taipei (TW);
Ping-Hung Chiang, Hsinchu (TW);
Chang-Po Hsiung, Hsinchu (TW);
Chia-Lin Wang, Yunlin County (TW);
Nien-Chung Li, Hsinchu (TW);
Wen-Fang Lee, Hsinchu (TW);
Shih-Yin Hsiao, Chiayi County (TW);
Chih-Chung Wang, Hsinchu (TW);
Kuan-Lin Liu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/136,982

(22) Filed: Apr. 24, 2016

(30) Foreign Application Priority Data

Apr. 7, 2016 (TW) .............................. 105110871 A

(51) Int. Cl.
| | | |
|---|---|---|
| *H01L 29/66* | (2006.01) | |
| *H01L 29/06* | (2006.01) | |
| *H01L 21/308* | (2006.01) | |
| *H01L 21/28* | (2006.01) | |
| *H01L 21/02* | (2006.01) | |

(52) U.S. Cl.
CPC ... *H01L 29/66568* (2013.01); *H01L 21/02238* (2013.01); *H01L 21/28167* (2013.01); *H01L 21/3081* (2013.01); *H01L 29/0649* (2013.01); *H01L 29/66681* (2013.01)

(58) Field of Classification Search
CPC .................... H01L 29/66568; H01L 21/02238; H01L 21/28167
USPC .......................... 257/192, 255, 333; 438/294
See application file for complete search history.

(56) References Cited

U.S. PATENT DOCUMENTS

| | | | |
|---|---|---|---|
| 6,033,991 A | 3/2000 | Ramkumar | |
| 6,225,167 B1 | 5/2001 | Yu | |
| 6,468,099 B2 | 10/2002 | Kim | |
| 2005/0003597 A1* | 1/2005 | Han | H01L 21/823842 438/197 |
| 2008/0173906 A1* | 7/2008 | Zhu | H01L 21/823807 438/197 |

* cited by examiner

*Primary Examiner* — Errol Fernandes
(74) *Attorney, Agent, or Firm* — Winston Hsu; Scott Margo

(57) ABSTRACT

A method of fabricating a MOS device is disclosed. A substrate having an active area (AA) silicon portion and shallow trench isolation (STI) region surrounding the active area is provided. A hard mask is formed on the substrate. A portion of the hard mask is removed to form an opening on the AA silicon portion. The opening exposes an edge of the STI region. The AA silicon portion is recessed through the opening to a predetermined depth to form a silicon spacer along a sidewall of the STI region in a self-aligned manner. An oxidation process is performed to oxidize the AA silicon portion and the silicon spacer to form a gate oxide layer.

12 Claims, 2 Drawing Sheets

METHOD OF FABRICATING SEMICONDUCTOR MOS DEVICE

CROSS REFERENCE TO RELATED APPLICATION

This application claims priority from Taiwan Patent Application Ser. No. 105110871 filed Apr. 7, 2016, which is included in its entirety herein by reference.

BACKGROUND OF THE INVENTION

1. Field of the Invention

The present invention relates generally to the field of semiconductor technology. More particular, the present invention relates to a method of fabricating a metal-oxide-semiconductor (MOS) device, which is suited for medium-voltage or high-voltage applications.

2. Description of the Prior Art

High-voltage metal-oxide-semiconductor (HVMOS) devices are widely used for many types of high-voltage circuits such as input/output circuits, CPU power supply circuits, power management systems, AC/DC converters, etc. The commonly seen HVMOS devices include lateral-diffused metal-oxide-semiconductor (LDMOS) devices and double-diffused drain MOS (DDDMOS) devices.

HVMOS devices need to sustain high voltages. Accordingly, the gate dielectrics of the HVMOS devices also need to sustain high gate-to-drain voltages. However, the prior art method of forming HVMOS devices has gate oxide corner thinning problem and time-dependent dielectric breakdown (TDDB) reliability issue.

SUMMARY OF THE INVENTION

It is one object of the invention to provide an improved method of fabricating a semiconductor MOS device in order to solve the above-mentioned prior art problems or shortcomings.

According to one embodiment of the invention, a method of fabricating a MOS device is disclosed. A substrate is provided. The substrate includes an active area (AA) silicon portion and a shallow trench isolation (STI) region surrounding the AA silicon portion. A hard mask is formed on the substrate. A portion of the hard mask is removed to form an opening on the AA silicon portion. The opening exposes an edge of the STI region. The AA silicon portion is recessed through the opening to a predetermined depth to form a silicon spacer along a sidewall of the STI region in a self-aligned manner. An oxidation process is performed to oxidize the AA silicon portion and the silicon spacer to form a gate oxide layer.

According to one embodiment of the invention, a gate electrode is formed on the gate oxide layer. A sidewall spacer is then formed on a sidewall of the gate electrode. A source or drain doping region is then formed in the AA silicon portion on either side of the gate electrode.

According to one embodiment of the invention, the gate oxide layer has a thickness $t_1$ at a central region and a thickness $t_2$ around the edge of the STI region, wherein $t_2/t_1$ is equal to or greater than 0.8.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
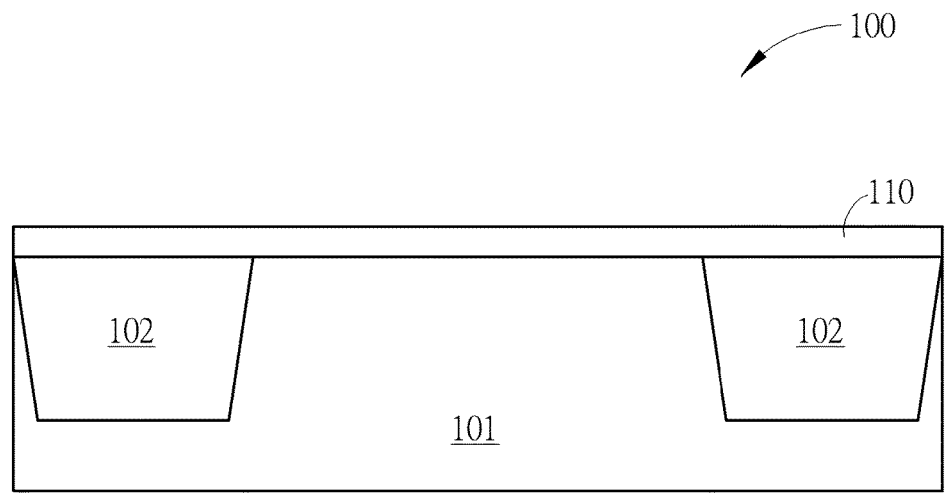
FIG. 1 to FIG. 4 are schematic, cross-sectional diagrams showing an exemplary method of fabricating a MOS device in accordance with one embodiment of the invention.

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Before describing the preferred embodiment in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete. The above description serves to distinguish the term "etching" from "removing." When etching a material, at least a portion of the material remains behind after the process is completed. In contrast, when removing a material, substantially all of the material is removed in the process. However, in some embodiments, "removing" is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although two different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "forming," "form,' 'deposit," or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

This invention pertains to a method of forming a metal-oxide-semiconductor (MOS) device that is compatible with current MOS processes, without the need of adding extra thermal budget and process steps. There is also no need to add an extra photomask or change the layout of current photomask. The prior art problems such as gate oxide corner thinning and Time-Dependent Dielectric Breakdown (TDDB) can be effectively solved. Further, the present invention method is suited for medium-voltage or high-voltage MOS processes.

Please refer to FIG. 1 to FIG. 4. FIG. 1 to FIG. 4 are schematic, cross-sectional diagrams showing an exemplary method of fabricating a MOS device in accordance with one embodiment of the invention. As shown in FIG. 1, a substrate 100 is provided. The substrate 100 includes an active area (AA) silicon portion 101 and a shallow trench isolation (STI) region 102. The STI region 102 surrounds the AA silicon portion 101. The substrate 100 may include, but not limited to, a silicon substrate, a silicon-containing substrate, a GaN-on-silicon substrate (or other materials of Group III-V), a grapheme-on-silicon substrate or a silicon-on-insulator (SOI) substrate, and so on.

According to one embodiment of the invention, the top surface of the AA silicon portion 101 may be substantially coplanar with the top surface of the STI region 102, but is not limited thereto. The AA silicon portion 101 may be an integral part of the substrate comprising, for example, silicon (e.g., single crystalline silicon, epitaxial silicon or polysilicon). The STI region 102 may comprises silicon oxide, but is not limited thereto.

Subsequently, a hard mask 110 is deposited on the substrate 100 in a blanket manner. The hard mask 110 covers the AA silicon portion 101 and the STI region 102. According to one embodiment of the invention, the hard mask 110 comprises silicon nitride, but is not limited thereto. For example, the hard mask 110 may further comprise a silicon oxide pad layer (not explicitly shown).

Figure 2:
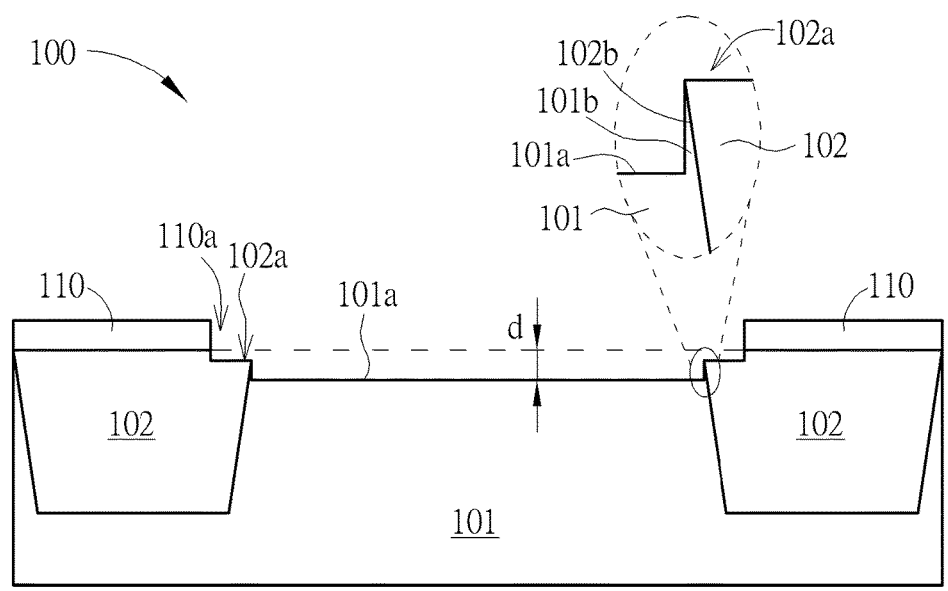

As shown in FIG. 2, a portion of the hard mask 110 is selectively removed to form an opening 110a directly on the AA silicon portion 101. The opening 110a exposes an edge 102a of the STI region 102. Subsequently, the AA silicon portion 101 is recessed through the opening 110a to a predetermined depth d to thereby form a recessed main surface 101a lower than the top surface of the STI region 102 and a silicon spacer 101b along a sidewall 102b of the STI region 102 in a self-aligned manner. According to one embodiment of the invention, the predetermined depth d ranges between 300 angstroms and 1000 angstroms.

As can be seen from the enlarged view in the circle region of FIG. 2, the silicon spacer 101b protrudes from the main surface 101a of the AA silicon portion 101, forming two horns. The silicon spacer 101b is formed structurally integral with the AA silicon portion 101. The silicon spacer 101b is in direct contact with the sidewall 102b of the STI region 102.

To recess the AA silicon portion 101 through the opening 110a to the predetermined depth d, the edge 102a of the STI region 102 is used as a shadow effect hard mask and an anisotropic etching process is performed to etch the AA silicon portion 101, thereby forming the silicon spacer 101b.

Figure 3:
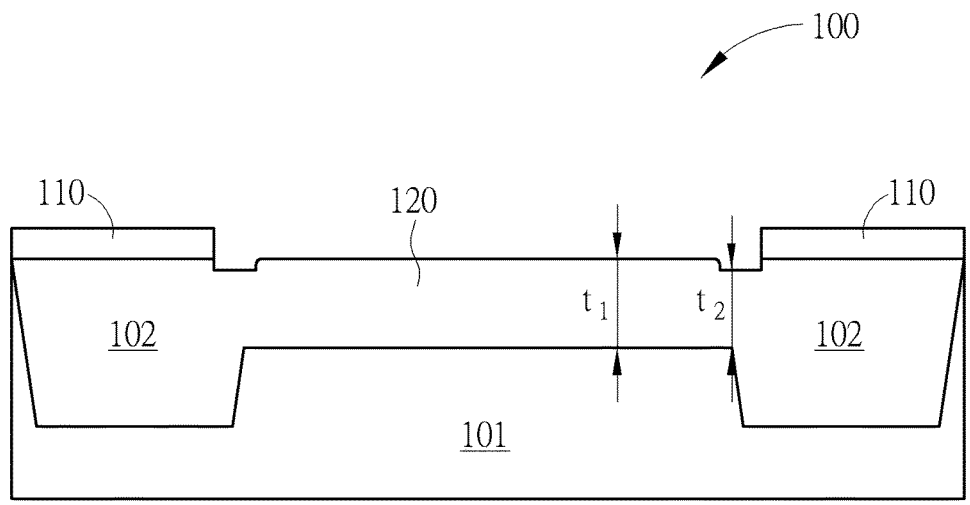

As shown in FIG. 3, an oxidation process is performed to oxidize the AA silicon portion 101 and the silicon spacer 101b to form a gate oxide layer 120. According to one embodiment of the invention, before the oxidation process, the AA silicon portion 101 may be subjected to a cleaning process in order to remove contaminants, microparticles or the native oxide layer.

According to one embodiment of the invention, the gate oxide layer 120 has a thickness $t_1$ at a central region and a thickness $t_2$ around the edge 102a of the STI region 102, wherein $t_2/t_1$ is equal to or greater than 0.8. According to one embodiment of the invention, for high-voltage (operating voltage between 20V~60V) MOS devices, the thickness $t_1$ is about 600 to 1200 angstroms, for medium-voltage (operating voltage between 6V~12V) MOS devices, the thickness $t_1$ may be about 100 to 250 angstroms, but is not limited thereto.

Figure 4:
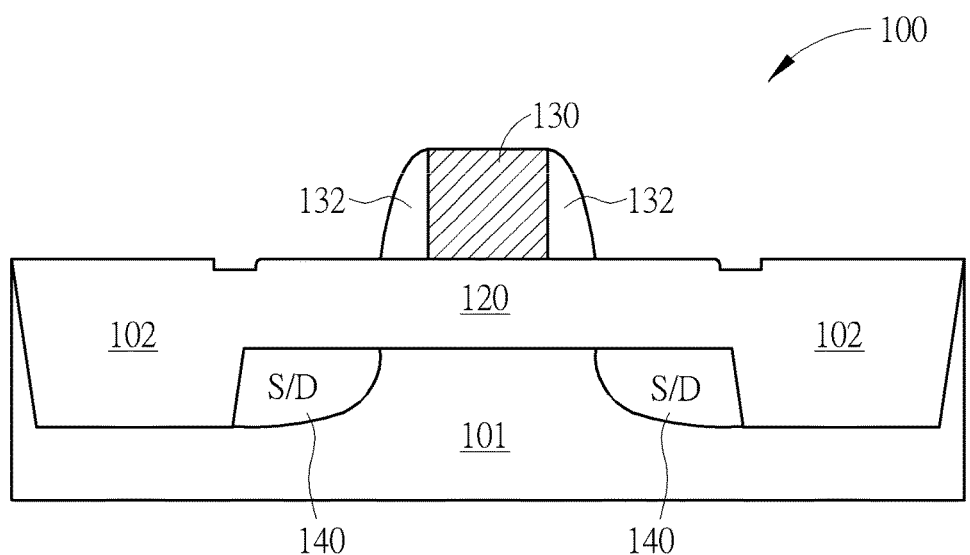

As shown in FIG. 4, after forming the gate oxide layer 120, the hard mask 110 is removed. Subsequently, a gate electrode 130 such as a polysilicon gate electrode is formed on the gate oxide layer 120. A sidewall spacer 132 is then formed on a sidewall of the gate electrode 130. Subsequently, an ion implantation process is performed to form a source or drain doping region 140 in the AA silicon portion 101 on either side of the gate electrode 130.

It is advantageous to use the present invention method because the AA silicon portion is recessed and a silicon spacer is formed in a self-aligned manner, which facilitates the formation of the gate oxide layer. The invention method is compatible with current MOS processes and extra thermal budget and process steps are not required. There is also no need to add an extra photomask or change the layout of the photomask. The prior art problems such as gate oxide corner thinning and Time-Dependent Dielectric Breakdown (TDDB) can be effectively solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a metal-oxide-semiconductor (MOS) device, comprising:
   providing a substrate having an active area (AA) silicon portion and a shallow trench isolation (STI) region surrounding the AA silicon portion;
   forming a hard mask on the substrate;
   removing a portion of the hard mask to form an opening on the AA silicon portion, wherein the opening exposes an edge of the STI region;
   recessing the AA silicon portion through the opening to a predetermined depth to form a silicon spacer along a sidewall of the STI region in a self-aligned manner; and
   performing an oxidation process to oxidize the AA silicon portion and the silicon spacer to form a gate oxide layer, wherein the silicon spacer is completely oxidized after the oxidation process.

2. The method according to claim 1, wherein the AA silicon portion comprises silicon and the STI region comprises silicon oxide.

3. The method according to claim 1, wherein the silicon spacer protrudes from a main surface of the AA silicon portion.

4. The method according to claim 1, wherein the silicon spacer is formed structurally integral with the AA silicon portion.

5. The method according to claim 1, wherein the silicon spacer is in direct contact with the sidewall of the STI region.

6. The method according to claim 1, wherein the step of recessing the AA silicon portion through the opening to the predetermined depth comprises:
   using the edge of the STI region as a shadow effect hard mask, performing an anisotropic etching process to etch the AA silicon portion to form the silicon spacer.

7. The method according to claim 1, wherein the predetermined depth ranges between 300 angstroms and 1000 angstroms.

8. The method according to claim 1, wherein the gate oxide layer has a thickness t1 at a central region and a thickness t2 around the edge of the STI region, wherein t2/t1 is equal to or greater than 0.8.

9. The method according to claim 8, wherein thickness t1 ranges between 600 angstroms and 1200 angstroms.

10. The method according to claim 1, wherein the hard mask comprise silicon nitride.

11. The method according to claim 1, wherein after forming the gate oxide layer, the method further comprises:
   removing the hard mask.

12. The method according to claim 11, wherein after removing the hard mask, the method further comprises:
   forming a gate electrode on the gate oxide layer;
   forming a sidewall spacer on a sidewall of the gate electrode; and
   forming a source or drain doping region in the AA silicon portion on either side of the gate electrode.

* * * * *